United States Patent
Wu et al.

(10) Patent No.: US 10,965,501 B2
(45) Date of Patent: *Mar. 30, 2021

(54) SHORT LINK EFFICIENT INTERCONNECT CIRCUITRY

(71) Applicant: Intel Corporation, Santa Clara, CA (US)

(72) Inventors: Hsinho Wu, Santa Clara, CA (US); Masashi Shimanouchi, San Jose, CA (US); Peng Li, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/736,436

(22) Filed: Jan. 7, 2020

(65) Prior Publication Data

US 2020/0145260 A1 May 7, 2020

Related U.S. Application Data

(63) Continuation of application No. 16/230,974, filed on Dec. 21, 2018, now Pat. No. 10,530,614.

(51) Int. Cl.
| | |
|---|---|
| *H03H 21/00* | (2006.01) |
| *H04L 25/03* | (2006.01) |
| *H04L 25/14* | (2006.01) |
| *G06N 20/00* | (2019.01) |

(52) U.S. Cl.
CPC .. *H04L 25/03019* (2013.01); *H04L 25/03114* (2013.01); *H04L 25/03343* (2013.01); *H04L 25/03878* (2013.01); *H04L 25/14* (2013.01); *G06N 20/00* (2019.01); *H03H 21/0012* (2013.01); *H04L 2025/03802* (2013.01)

(58) Field of Classification Search
USPC .......................................................... 375/340
See application file for complete search history.

(56) References Cited

U.S. PATENT DOCUMENTS

| | | | | |
|---|---|---|---|---|
| 10,530,614 | B2* | 1/2020 | Wu | H04L 25/03019 |
| 2014/0093245 | A1* | 4/2014 | Kim | H04B 10/40 |
| | | | | 398/82 |
| 2016/0277221 | A1* | 9/2016 | Wortman | G11C 19/00 |
| 2017/0294906 | A1* | 10/2017 | Wagh | G01R 31/67 |
| 2019/0034377 | A1* | 1/2019 | Chen | G06F 13/4282 |
| 2020/0213074 | A1* | 7/2020 | Shimomura | H04L 7/00 |

OTHER PUBLICATIONS

Lim, Jane, "High Speed Serial Links—Design Trends and SI Challenges," Cisco CHG, Switching SI, Dec. 5, 2014.
OIF CEI-56G Application Note, Optical Internetworking Forum, OFC 2016.

* cited by examiner

*Primary Examiner* — Eva Y Puente
(74) *Attorney, Agent, or Firm* — Fletcher Yoder P.C.

(57) ABSTRACT

Systems and methods for electronic devices including two or more semiconductor devices coupled via an interconnect. The interconnect includes multiple lanes each having a link between the first and second semiconductor devices. One or more lanes of the multiple lanes each include clock and data recovery circuitry to perform full clock and data recovery. One or more other lanes of the multiple lanes each do not include clock and data recovery circuitry and instead includes a phase adjustment and clock multiplier circuit that is slave to clock and data recovery circuitry of the one or more lanes.

20 Claims, 4 Drawing Sheets

SHORT LINK EFFICIENT INTERCONNECT CIRCUITRY

CROSS-REFERENCE TO RELATED APPLICATIONS

This application is a continuation of U.S. patent application Ser. No. 16/230,974, filed on Dec. 21, 2018, which is incorporated by reference herein in its entirety for all purposes.

BACKGROUND

This disclosure relates to links through an interconnect for a semiconductor device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Two or more semiconductor components may be included together in a single package. An interconnect (e.g., via an interposer or an interconnect bridge embedded in a substrate) may provide connections in the package. As components of the package become more integrated together, higher throughput is used, which, in turn, results in a higher density of active-circuit blocks and a smaller area for heat dissipation. Furthermore, interconnect overhead may exacerbate this issue. That package may include one or more clock domains that the interconnect navigates. For instance, in transferring data across the interconnect, for each lane of the interconnect, the package may include clock and data recovery circuitry that is relatively large and power hungry relative to other circuits for each lane.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
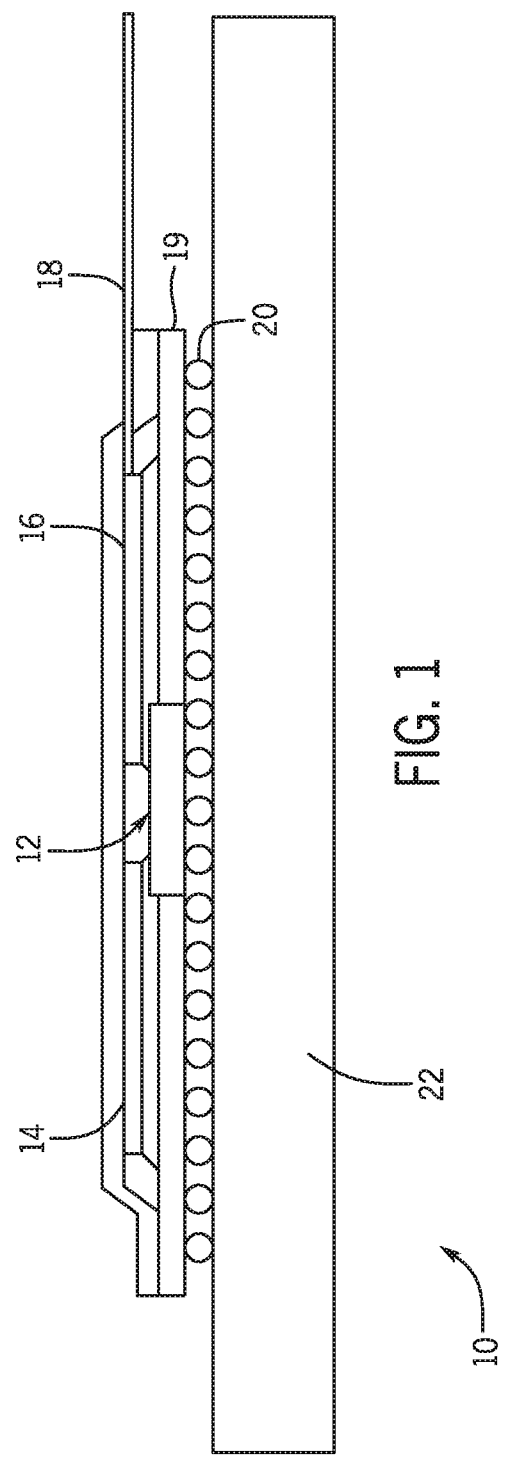
FIG. 1 is a diagram of a semiconductor device that utilizes short link efficient interconnect circuitry, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

As previously discussed, interconnects provide connections in electronic devices. As components of the electronic devices become more integrated together, higher throughput is used, which, in turn, results in a higher density of active-circuit blocks and a smaller area for heat dissipation. By reducing channel loss of transceiver devices, power consumption (and heat production) may generally be reduced in the transceiver devices. The interconnect scheme discussed herein includes reduced channel loss and reduced power consumption. Specifically, the interconnect takes advantage of the short nature of die-to-die (D2D) connections, die-to-optical-electrical-module (D2OE) connections, die-to-memory (D2M) connections, and/or similar connections in an electronic device package. For instance, the D2D, D2OE, D2M, and/or similar connections may use extra short reach (XSR) links having an overall length less than 50 mm or may use ultra short reach (USR) links having an overall length less than 10 mm. As discussed below, due to these short distances and low corresponding voltages may result in reduced equalization utilization compared to longer links and/or may result in smaller signal swings and overall amplitude. Due to the reduced equalization utilization, full clock and data recovery (CDR) with CDR circuitry in each lane may be foregone by omitting the CDR circuitry from at least some lanes of the interconnect. Instead, those lanes may use phase adjustment and clock multiplier (PA/M) circuitries to replace the CDR circuitry and may act as a slave of a CDR in another lane of the interconnect.

FIG. 1 is a diagram of an electronic device 10. The die may include a system-on-chip (SOC) and/or any other electronic device with multiple components. The electronic device 10 includes an interconnect 12. The interconnect 12 for the electronic (e.g., semiconductor) device 10 provides links between a component 14 and a component 16 of the electronic device 10. The components 14 and/or 16 may include one or more die or other components. For instance, the die of the component 14 may include a programmable fabric (e.g., as part of a field-programmable gate array (FPGA) device), a CPU, an application-specific integrated circuit, memory, and/or other suitable die for use in an electronic device. Furthermore, the SOC may be a photonic-integrated SOC that incorporates optical circuitry to perform photonic functions. For instance, the photonic-integrated SOC may provide the interconnect 12 between the component 14 as a die and the component 16 as an optical engine that provides connectivity of the die to optical fiber 18 for fiber optics. Although the illustrated embodiment depicts the electronic device 10 as a photonic-integrated SOC, the electronic device 10 may additionally or alternatively include a transceiver/serializer/deserializer (SerDes)-integrated SOC. Furthermore, additionally or alternative, the electronic device 10 may include multiple integrated SOCs.

The electronic device 10 may also include a substrate 19 to which the components 14 and 16 may be coupled. Additionally or alternatively, the electronic device 10 may utilize an embedded interconnect bridge (EMIB) to couple the components 14 and 16 together. For instance, the substrate 19 may be an interposer to which the components 14 and 16 are mounted. The substrate 19 may use microbumps 20 to couple to a circuit board 22. The electronic device 10 may communicate with other electronic components via the optical fiber 18 and/or the circuit board 22.

Figure 2:
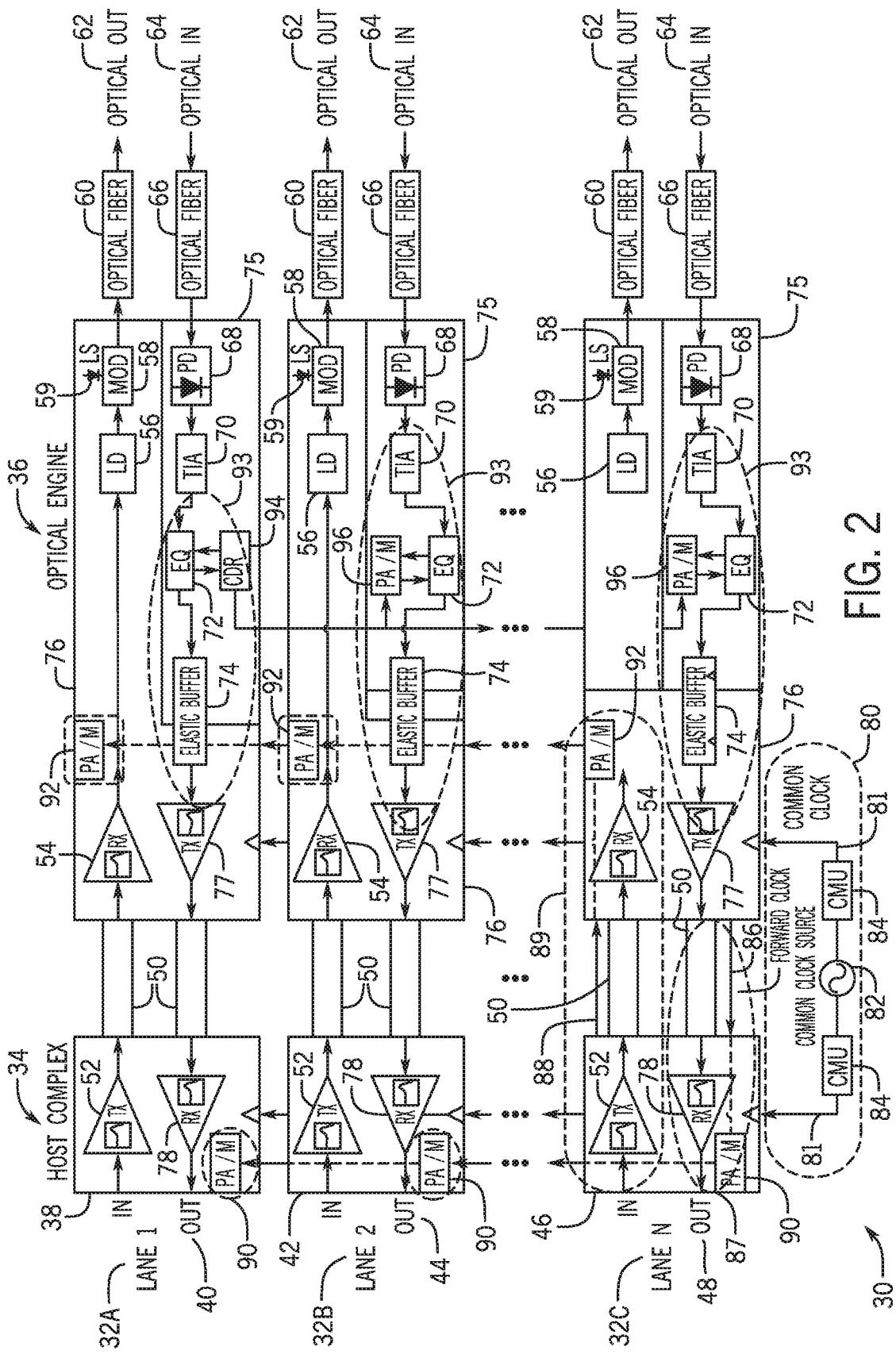
FIG. 2 is a schematic diagram of the short link efficient interconnect circuitry of FIG. 1, in accordance with an embodiment.

FIG. 2 is a schematic diagram of a connection 30 having multiple lanes 32 between a host complex 34 (e.g., component 14) and an optical engine 36 (e.g., component 16). Each lane 32 includes a host-to-optical (e.g., outgoing) channel and an optical-to-host (e.g., incoming) channel. For instance, the lane 32A includes a host-to-optical channel 38 and an optical-to-host channel 40, the lane 32B includes a host-to-optical channel 42 and an optical-to-host channel 44, and the lane 32C includes a host-to-optical channel 46 and an optical-to-host channel 48. Each of the host-to-optical channels 38, 42, and 46 and the optical-to-host channels 40, 44, and 48 each includes a link 50 (e.g., through the interconnect 12) between the host complex 34 and the optical engine 36.

Each host-to-optical channel 38, 42, and 46 includes a transmitter 52 that transmits signals over a corresponding link 50 to a receiver 54 in the optical engine 36. The receiver 54 receives the signals and transmits them to a laser driver 56 that causes a modulator 59 to modulate a laser 58 to cause transmission of optical signals over an optical fiber 60 as an optical output 62 from the electronic device 10.

Similar to the host-to-optical channels 38, 42, and 46, the optical-to-host channels 40, 44, and 48 each receives optical signals via an optical input 64 and over an optical fiber 66. The optical signals are received from the optical fiber 66 at a photo detector 68 that converts the optical signals into electrical signals. The electrical signals are then passed to a transimpedance amplifier 70. The transimpedance amplifier 70 may be used to ameliorate attenuation of light in the optical fiber 66 and/or to amplify the electrical signals that are passed to an equalizer 72. The equalizer 72 passes electrical signals to an elastic buffer 74 that is used to ensure data integrity when bridging a clock domain 75 of the optical engine 36 to a clock domain 76 of the host complex 34. For instance, the elastic buffer 74 may be a FIFO where data is deposited using a rate set by a clock of the clock domain 75 and removed using a rate set by a clock of the clock domain 76. In other words, by including the elastic buffer 74 in the optical engine 36, clock domain conversions for the optical-to-host channels 40, 44, and 48 are performed in the optical engine 36 before transfer over the corresponding data links 50 using transmitters 77. The data transmitted by the transmitters 77 is received by receivers 78 of the host complex 34.

The clock domains 75 and 77 both utilize a clocking system 80 that outputs a common clock 81 to both the host complex 34 and the optical engine 36 from a common clock source 82 via clock management units 84. The common clock 81 is passed into the optical engine 36 and forwarded as a forward clock 86 to the host complex 34 along the link 50. Similarly, the common clock 81 is passed into the host complex 34 and forwarded as a forward clock 88 to the optical engine 36 along the link 50. The common clock 81 may be used to drive various circuitry in the host complex 34, but the forward clock 86 is used to control phase adjustment and clock multipliers (PA/Ms) 90 in the host complex 34. Similarly, the common clock 81 may be used to drive various circuitry in the optical engine 36, but the forward clock 88 is used to control PA/Ms 92 in the optical engine 36.

Each optical-to-host channel 40, 44, and 48 includes some circuitry to control the respective equalizer 72 in the respective channel. For instance, the optical-to-host channel 40 may include clock and data recovery (CDR) circuitry 94 to control equalization of the incoming data. The CDR circuitry 94 is used to recover a clock using data changes in the optical signals and to then recover data using the recovered clock. However, the CDR circuitry 94 may be relatively power hungry, larger, and/or slower to calibrate/adapt than PA/Ms 96 in lanes 32B and 32C. Thus, by using a single CDR circuitry 94 in one of multiple channels and having multiple PA/Ms 96 acting as slaves to the CDR circuitry 94, the lanes 32B and 32C may consume less power than the lane 32A. Furthermore, when the links 50 include routing longer than a certain length (e.g., longer than extra short reach (XSR) and ultra short reach (USR)), each equalizer 72 may utilize separate CDR circuitries instead of the CDR-PA/M scheme due to the longer length of the links. Thus, by taking advantage of the nature of the links 50 for use in short connections (e.g., XSR or USR), CDR circuitries may be replaced by lower-power PA/Ms in certain lanes (e.g., in all but one lane), thereby reducing power, area, and/or calibration/adaption time.

Furthermore, the clocking scheme illustrated in the connection 30 provides a flexible clocking scheme that supports single or multiple clock domains. Furthermore, the common clock 81 and/or the forward clocks 86, 88 in a simple channel equalization scheme that combines production characterizations, calibrations, and equalization tuning to fully utilize the short distances of the links 50 and channel characteristics.

Figure 3:
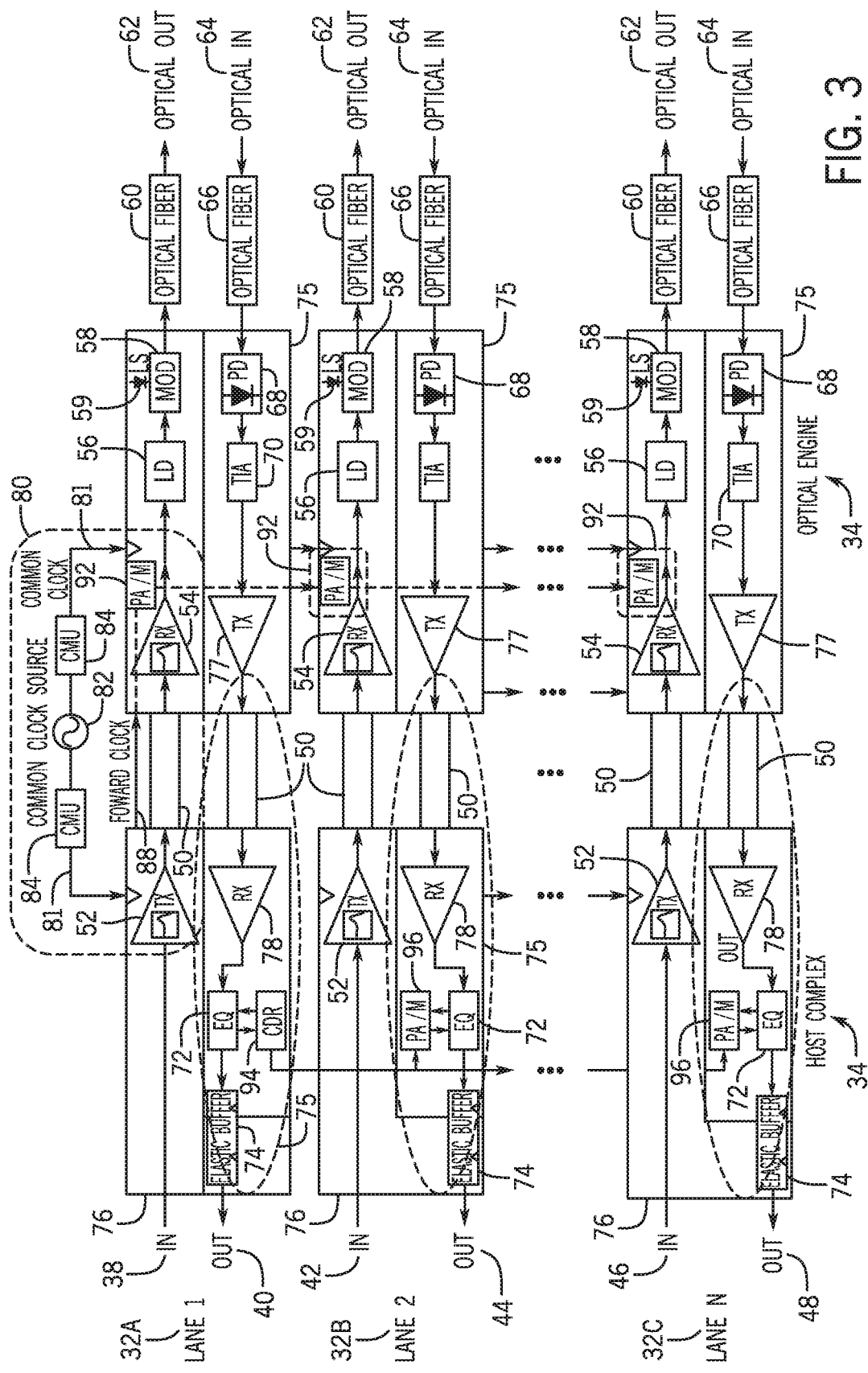
FIG. 3 is a schematic diagram of the short link efficient interconnect circuitry of FIG. 1, in accordance with an embodiment.

FIG. 3 is a schematic diagram of a connection 100 that is similar to the connection 30 except that the CDR circuitry 94 for the lane 32A is moved to the host complex 34. In some embodiments, the host complex 34 may utilize more robust equalization that may be better suited for performing clock and data recovery. Furthermore, the connection 100 utilizes elastic buffers 74 and equalizers 72 (and associated circuitry) in the host complex 34 rather than in the optical engine 36. Thus, in the connection 100, the clock domain 75 extends across the links 50 and the host complex 34 transitions incoming signals into the clock domain 76. Furthermore, since the transition for optical-to-host channels 40, 44, and 48 occur in the host complex 34, the forward clock 86 and associated PA/Ms 90 may be omitted from the connection 100 when they are included in the connection 30. Beyond these differences, the two connections 30 and 100 may be structured similarly and vary based on where clock domain switching occurs. Both the connections 30 and 100 may utilize the CDR circuitry 94 in a single lane 32A to drive slave PA/Ms 96 to reduce power, area, and/or calibration/adaption time over connections utilizing CDR circuitry for each lane of a connection.

Figure 4:
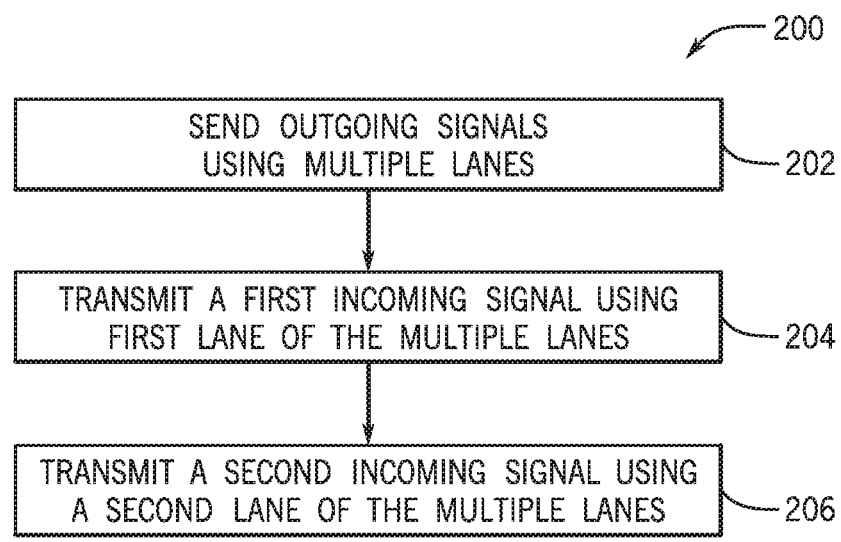
FIG. 4 is a block diagram of a memory block of the semiconductor device, in accordance with an embodiment.

FIG. 4 is a flow diagram of a process 200 that may be used by the electronic device 10. The electronic device 10 sends outgoing signals using multiple lanes of an interconnection between a first semiconductor component (e.g., component 14) and a second semiconductor component (e.g., component 16) (block 202), The outgoing signals go out from the first semiconductor component to the second semiconductor component.

The electronic device 10 also transmits a first incoming signal from the second semiconductor component to the first semiconductor component using a first lane of the multiple lanes (block 204). Transmitting the first incoming signal includes transitioning the first incoming signal from a first clock domain corresponding to the second semiconductor device to a second clock domain corresponding to the first semiconductor device. Moreover, transitioning the first incoming signal from the first clock domain to the second clock domain comprises utilizing clock and data recovery circuitry corresponding to the first land.

The electronic device 10 further transmits a second incoming signal from the second semiconductor component to the first semiconductor component using a second lane of the multiple lanes (block 206). Transmitting the second incoming signal includes transitioning the second incoming signal from the first clock domain to the second clock domain, and transitioning the second incoming signal from the first clock domain to the second clock domain includes utilizing phase adjustment and clock multiplier circuitry that is a slave to the clock and data recovery circuitry.

Figure 5:
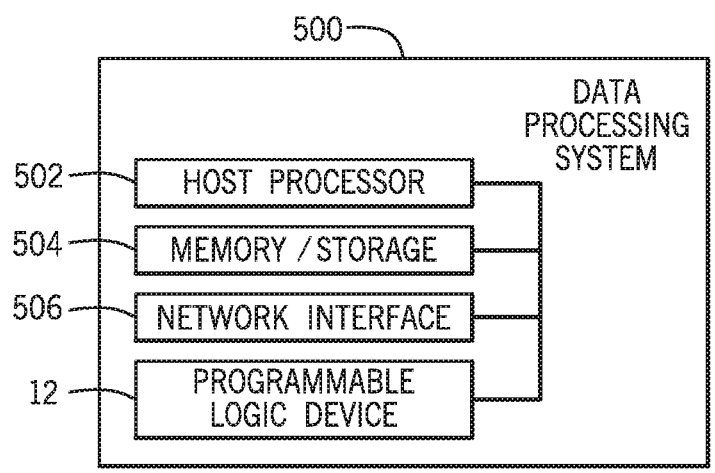
FIG. 5 is a block diagram of a data processing system that may use the semiconductor device to respond rapidly to data processing requests, in accordance with an embodiment.

With the foregoing in mind, the electronic device 10 may be a part of a data processing system or may be a component of a data processing system that may benefit from use of the low-power interconnect links discussed herein. For example, the electronic device 10 may be a component of a data processing system 500, shown in FIG. 5. The data processing system 500 includes a host processor 502, memory and/or storage circuitry 504, and a network interface 506. The data processing system 500 may include more or fewer components (e.g., electronic display, user interface structures, application specific integrated circuits (ASICs)).

The host processor 502 may include any suitable processor, such as an INTEL® XEON® processor or a reduced-instruction processor (e.g., a reduced instruction set computer (RISC), an Advanced RISC Machine (ARM) processor) that may manage a data processing request for the data processing system 500 (e.g., to perform machine learning, video processing, voice recognition, image recognition, data compression, database search ranking, bioinformatics, network security pattern identification, spatial navigation, or the like). The memory and/or storage circuitry 504 may include random access memory (RAM), read-only memory (ROM), one or more hard drives, flash memory, or the like. The memory and/or storage circuitry 504 may be considered external memory to the electronic device 10 and may hold data to be processed by the data processing system 500 and/or may be internal to the electronic device 10 (e.g., as the components 14 and 16). In some cases, the memory and/or storage circuitry 504 may also store configuration programs (e.g., bitstream) for programming a programmable fabric of the electronic device 10. The network interface 506 may permit the data processing system 500 to communicate with other electronic devices. The data processing system 500 may include several different packages or may be contained within a single package on a single package substrate.

In one example, the data processing system 500 may be part of a data center that processes a variety of different requests. For instance, the data processing system 500 may receive a data processing request via the network interface 506 to perform machine learning, video processing, voice recognition, image recognition, data compression, database search ranking, bioinformatics, network security pattern identification, spatial navigation, or some other specialized task. The host processor 502 may cause a programmable logic fabric of the electronic device 10 to be programmed with a particular accelerator related to requested task. For instance, the host processor 502 (e.g., component 14) may instruct that configuration data (bitstream) be stored on the memory/storage circuitry 504 or cached in sector-aligned memory of the electronic device 10 to be programmed into the programmable logic fabric of the electronic device 10. The configuration data (bitstream) may represent a circuit design for a particular accelerator function relevant to the requested task.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few. Furthermore, although the foregoing discusses an interconnect between a die and an optical engine, interconnects between other electronic devices may employ similar techniques. For instance, in some embodiments, the optical engine may be replaced or supplemented with a transceiver/serializer-deserializer engine. Additionally or alternatively, the optical engine may be replaced with any semiconductor die that may be connected to another die using the links 50. For instance, the first and second components 14 and 16 may each be a die each including one or more of the following: an FPGA, a CPU, an ASIC, memory, and other semiconductor die used in computing devices and/or included on an SOC.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . " it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An electronic device comprising:
an interconnect coupling a first semiconductor device and a second semiconductor device, wherein the interconnect comprises a plurality of lanes that respectively comprise a link between the first and second semiconductor devices, wherein a first lane of the plurality of lanes comprises clock and data recovery circuitry that drives a phase adjustment and a clock multiplication in a second lane of the plurality of lanes, and wherein the first lane comprises an equalizer that adjusts incoming signals based at least in part on controls from the clock and data recovery circuitry.

2. The electronic device of claim 1, comprising an equalizer that corresponds to the second lane, wherein the equalizer is configured to adjust incoming signals based at least in part on controls from the phase adjustment and clock multiplier circuit.

3. The electronic device of claim 1, wherein the first semiconductor device comprises multiple die.

4. The electronic device of claim 3, wherein the multiple die comprise a field-programmable gate array, a central processing unit, a memory, an application-specific integrated circuitry, or any combination thereof.

5. The electronic device of claim 1, wherein the second semiconductor device comprises multiple die.

6. The electronic device of claim 1, wherein the second semiconductor device comprises an optical engine that provides an interface between the first semiconductor device and an optical fiber via the interconnect.

7. The electronic device of claim 1, wherein the plurality of lanes respectively comprise:
an outgoing channel from the first semiconductor device to the second semiconductor device; and
an incoming channel from the second semiconductor device to the first semiconductor device.

8. The electronic device of claim 7, wherein the respective outgoing channels of the plurality of lanes use a common clock and a forward clock that is generated from the common clock and transported over a respective link from the first semiconductor device to the second semiconductor device.

9. The electronic device of claim 7, wherein the incoming channel of the first lane uses the clock and data recovery circuit, and wherein the incoming channel of the second lane is driven by the clock and data recovery circuit.

10. The electronic device of claim 1, wherein the second semiconductor device comprises the clock and data recovery circuitry of the first lane, wherein the second semiconductor device comprises an elastic buffer in each of the plurality of lanes, and wherein the second semiconductor device, in each of the plurality of lanes, translates signals targeted for the first semiconductor device from a first clock domain to a second clock domain before the signals are transmitted over a respective link to the first semiconductor device.

11. The electronic device of claim 1, wherein the first semiconductor device comprises the clock and data recovery circuitry of the first lane, and wherein the first semiconductor device comprises an elastic buffer in each of the plurality of lanes.

12. The electronic device of claim 1, wherein the second semiconductor device passes through, to the first semiconductor device, an embedded clock signal with incoming data received at the second semiconductor device.

13. The electronic device of claim 1, wherein a respective link of the plurality of lanes comprises an extra short reach or an ultra short reach.

14. The electronic device of claim 1, wherein the second semiconductor device comprises a transceiver/serial-deserializer engine.

15. A method, comprising:
sending outgoing signals using a plurality of lanes of an interconnection between a first semiconductor component and a second semiconductor component, wherein outgoing signals go out from the first semiconductor component to the second semiconductor component;
transmitting a first incoming signal from the second semiconductor component to the first semiconductor component using a first lane of the plurality of lanes, wherein transmitting the first incoming signal comprises transitioning the first incoming signal from a first clock domain corresponding to the second semiconductor component to a second clock domain corresponding to the first semiconductor component, and wherein transitioning the first incoming signal from the first clock domain to the second clock domain comprises utilizing clock and data recovery circuitry corresponding to the first lane; and
transmitting a second incoming signal from the second semiconductor component to the first semiconductor component using a second lane of the plurality of lanes, wherein transmitting the second incoming signal comprises transitioning the second incoming signal from the first clock domain to the second clock domain that is driven by the clock and data recovery circuitry.

16. The method of claim 15, wherein transitioning the first and second incoming signals comprises respectively equalizing the first and second incoming signals using respective first and second equalizers.

17. The method of claim 16, wherein equalizing the first incoming signal using the first equalizer comprises driving the first equalizer based at least in part on control signals from the clock and data recovery circuitry.

18. The method of claim 16, wherein equalizing the second incoming signal using the second equalizer comprises driving the second equalizer based at least in part on control signals from a phase adjustment and clock multiplier of the second lane.

19. A system-on-a-chip comprising:
a circuit board;
a substrate coupled to the circuit board;
a first semiconductor device coupled to the substrate;
a second semiconductor device coupled to the substrate; and
an interconnect coupled between the first and second semiconductor devices, wherein the system-on-a-chip comprises a connection including portions of the first semiconductor device, the second semiconductor device, and the interconnect, wherein the connection comprises a plurality of lanes comprising:
a plurality of outgoing channels receiving outgoing data from the first semiconductor device and transmitting the outgoing data to the second semiconductor device over the interconnect; and
a plurality of incoming channels receiving incoming data at the second semiconductor device and transmitting the incoming data over the interconnect to the first semiconductor device, wherein each incoming channel transfers incoming data between a first clock domain of the second semiconductor device and a second clock domain of the first semiconductor device, wherein a single incoming channel utilizes clock and data recovery circuitry to transfer the incoming data between the first clock domain and the second clock domain and to drive a transfer of the incoming data between the first clock domain and the second clock domain in remaining incoming channels of the plurality of incoming channels.

20. The system-on-a-chip of claim 19, wherein the single incoming channel comprises an equalizer that adjusts the incoming data.

\* \* \* \* \*